United States Patent
Cao et al.

(10) Patent No.: US 9,253,905 B2
(45) Date of Patent: Feb. 2, 2016

(54) SURFACE CONTACT CARD HOLDER FOR ELECTRONIC DEVICES

(71) Applicants: SHENZHEN FUTAIHONG PRECISION INDUSTRY CO., LTD., Shenzhen (CN); FIH (Hong Kong) Limited, Kowloon (HK)

(72) Inventors: Guang-Fei Cao, Shenzhen (CN); Lei Wang, Shenzhen (CN)

(73) Assignees: SHENZHEN FUTAIHONG PRECISION INDUSTRY CO., LTD., Shenzhen (CN); FIH (Hong Kong) Limited, Kowloon (HK)

( * ) Notice: Subject to any disclaimer, the term of this patent is extended or adjusted under 35 U.S.C. 154(b) by 299 days.

(21) Appl. No.: 13/931,431

(22) Filed: Jun. 28, 2013

(65) Prior Publication Data

US 2014/0055926 A1 Feb. 27, 2014

(30) Foreign Application Priority Data

Aug. 24, 2012 (CN) .......................... 2012 1 0303907

(51) Int. Cl.
*G06F 1/16* (2006.01)
*H05K 5/02* (2006.01)
*H04B 1/3816* (2015.01)

(52) U.S. Cl.
CPC ............ *H05K 5/0226* (2013.01); *H04B 1/3816* (2013.01); *H05K 5/0217* (2013.01)

(58) Field of Classification Search
CPC ... H04B 1/3816; H04B 1/3818; G06F 1/1656
USPC ..................................... 361/679.31
See application file for complete search history.

(56) References Cited

U.S. PATENT DOCUMENTS

| | | | |
|---|---|---|---|
| 2004/0062010 A1* | 4/2004 | Pan et al. ...................... | 361/715 |
| 2009/0280670 A1* | 11/2009 | Feng ............................ | 439/326 |
| 2010/0234070 A1* | 9/2010 | Li et al. ........................ | 455/558 |
| 2013/0155589 A1* | 6/2013 | Takabayashi ............ | 361/679.01 |

* cited by examiner

*Primary Examiner* — Anthony Q Edwards
(74) *Attorney, Agent, or Firm* — Novak Druce Connolly Bove + Quigg LLP

(57) ABSTRACT

A holder for a surface contact card includes a main body, a pivotal shaft, and a cover. The main body has a latching block and defines a receiving groove configured for receiving a surface contact card. The cover includes a hinge portion and a latching tab. The pivotal shaft extends through the hinge portion and rotatably connects to the main body. The cover is pivotally and slidably engaged with the main body for covering the receiving groove, and the latching tab is latched with the block.

7 Claims, 7 Drawing Sheets

SURFACE CONTACT CARD HOLDER FOR ELECTRONIC DEVICES

BACKGROUND

1. Technical Field

The present disclosure generally relates to cards used in electronic devices, and particularly to a surface contact card holder for an electronic device.

2. Description of Related Art

Surface contact cards having special circuits are widely used in portable electronic devices to enhance or specialize the functions of the portable electronic devices. For example, a subscriber identity module (SIM) card in a mobile phone can dedicate the mobile phone's functions to the SIM card owner. By changing SIM cards, a single mobile phone can be used by many different SIM card owners as a personal phone.

Although surface contact card holders are simple, it can be difficult to remove the surface contact card from the surface contact card holder.

Therefore, there is room for improvement within the art.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the surface contact card holder. Moreover, in the drawings, like reference numerals designate corresponding parts throughout the several views.

DETAILED DESCRIPTION

The disclosed surface contact card holder holds surface contact cards such as SIM cards, compact flash cards (CFs), multimedia cards (MMCs), and others. The disclosed electronic device, shown in the exemplary embodiment as a mobile phone, can alternatively be a personal digital assistant (PDA), camera, recorder, or other device remaining well within the scope of the disclosure.

Figure 1:
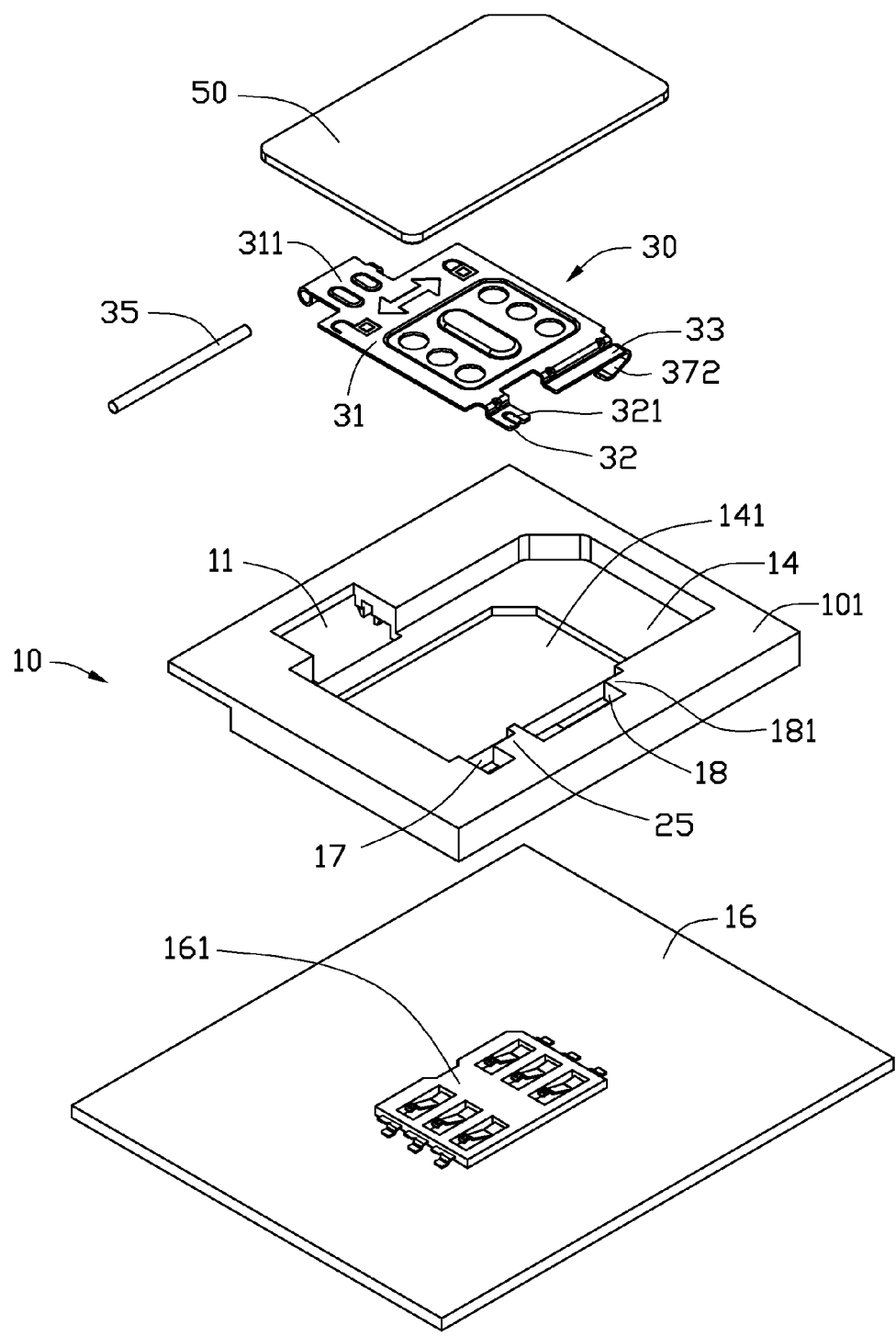
FIG. 1 is an exploded, isometric view of a surface contact card holder including a main body and a cover in accordance with an exemplary embodiment.

FIG. 1 shows a surface contact card holder, which receives a surface contact card 50. The surface contact card holder includes a main body 10, a printed circuit board 16, a cover 30, and a pivotal shaft 35. The printed circuit board 16 is positioned at one side of the main body 10. The cover 30 is pivotably and slidably connected to the main body 10 by the pivotal shaft 35. The printed circuit board 16 has a connector 161.

Figure 2:
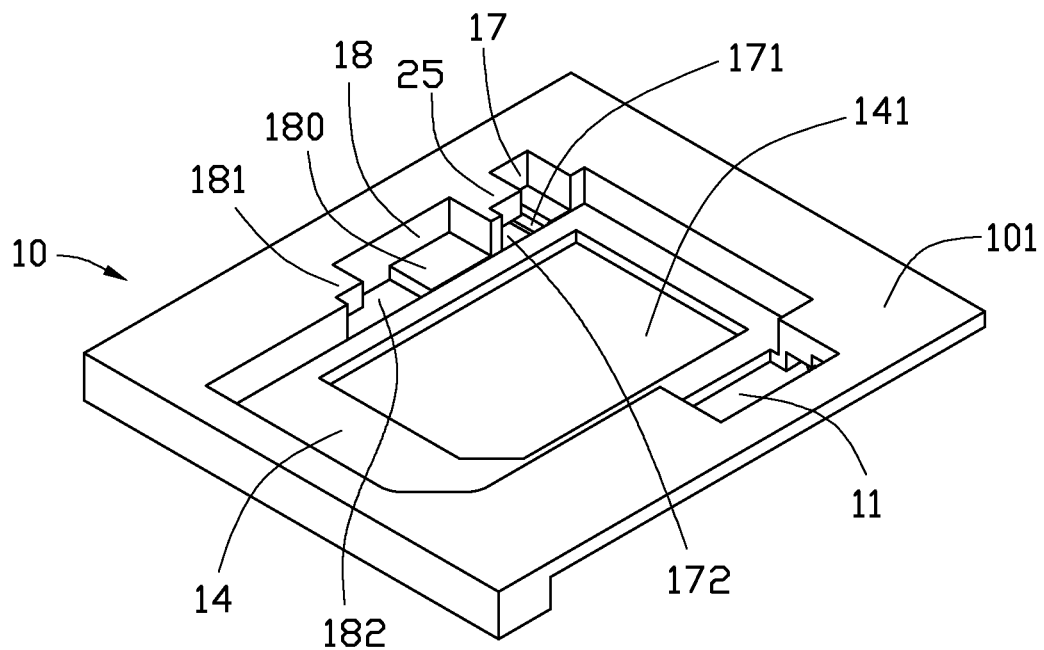
FIG. 2 is an enlarged view of the main body shown in FIG. 1
Figure 3:
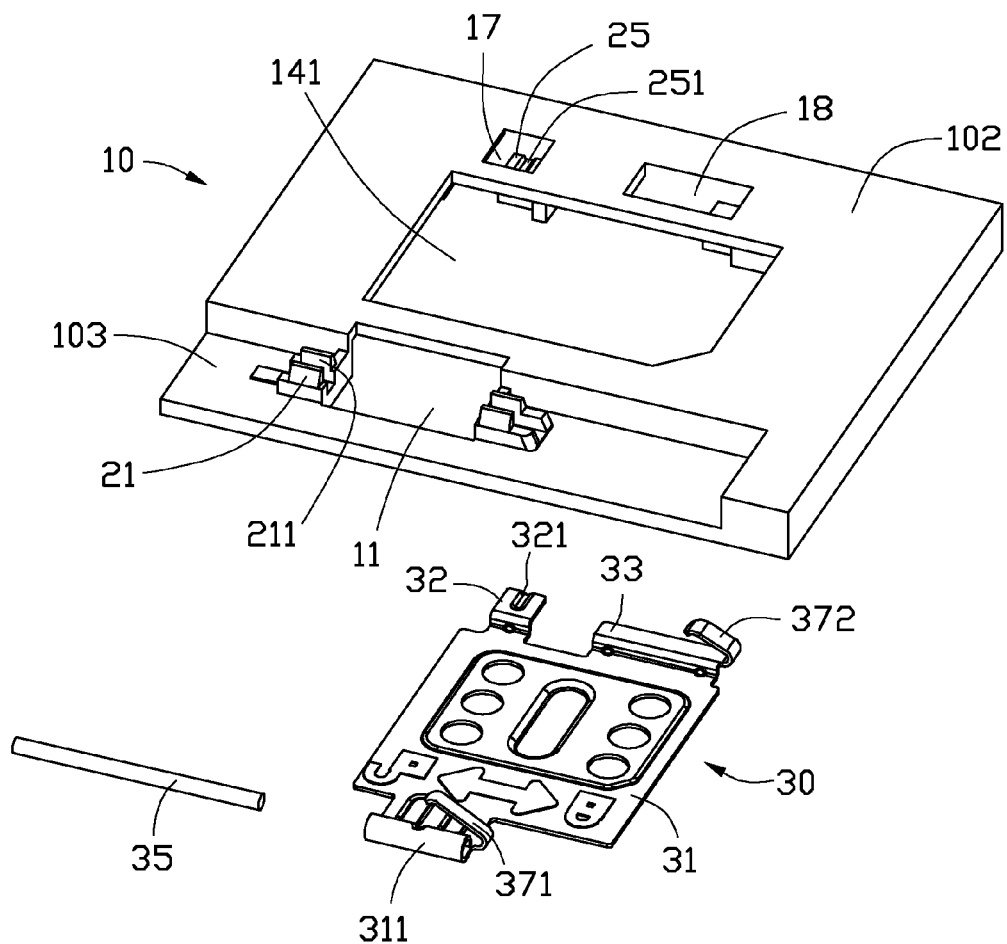
FIG. 3 is similar to FIG. 1, but shown from another aspect.

Referring to FIG. 2, the main body 10 is assembled in a housing of an electronic device or is integrally formed with the housing of the electronic device. The main body 10 has a first surface 101 and a second surface 102. The first surface 101 defines a side slot 11, a receiving groove 14, and a through hole 141. The side slot 11 is adjacent to a first side of the receiving groove 14. The connector 161 is exposed via the through hole 141. The first surface 101 defines a positioning groove 17, a latching groove 18, and a block 25 between them at a second side of the receiving groove 14. The positioning groove 17 and the latching groove 18 communicate with the receiving groove 14. The positioning groove 17 has a bottom surface 171 and a positioning hole 172. The latching groove 18 has a bottom wall 180 and a stepped edge 181. The block 25 defines a notch 251 in an inner surface of itself toward the bottom surface 171. Referring to FIG. 3, the second surface 102 defines a recess 103 containing the side slot 11. Two latching portions 21 are formed on the recess 102 and are at opposite sides of the side slot 11. Each latching portion 21 defines a containing groove 211.

The cover 30 is made of metal. Note that as used herein, "made of metal" may mean or include a non-metallic material coated with a metallic (magnetic) material. The cover 30 includes a cover body 31, a hinge portion 311, a latching tab 32, an extending plate 33, a first finger 371, and a second finger 372. The cover body 31 is slidably received in the receiving groove 14. The hinge portion 311 is substantially cylindrical and extends from one side of the cover body 31. The hinge portion 311 is shorter than the side slot 11, allowing the hinge portion 311 to slide in the side slot 11. The pivotal shaft 35 is received in the hinge portion 311. The latching tab 32 and the extending plate 33 extend from another side of the cover body 31 and are spaced from each other. The latching tab 32 is slidably received in the positioning groove 17, and the extending plate 33 is slidably received in the latching groove 18. A protrusion 321 is formed on the latching tab 32. The first finger 371 is located adjacent to the hinge portion 311, and the second finger 372 is located adjacent to the extending plate 33.

Figure 4:
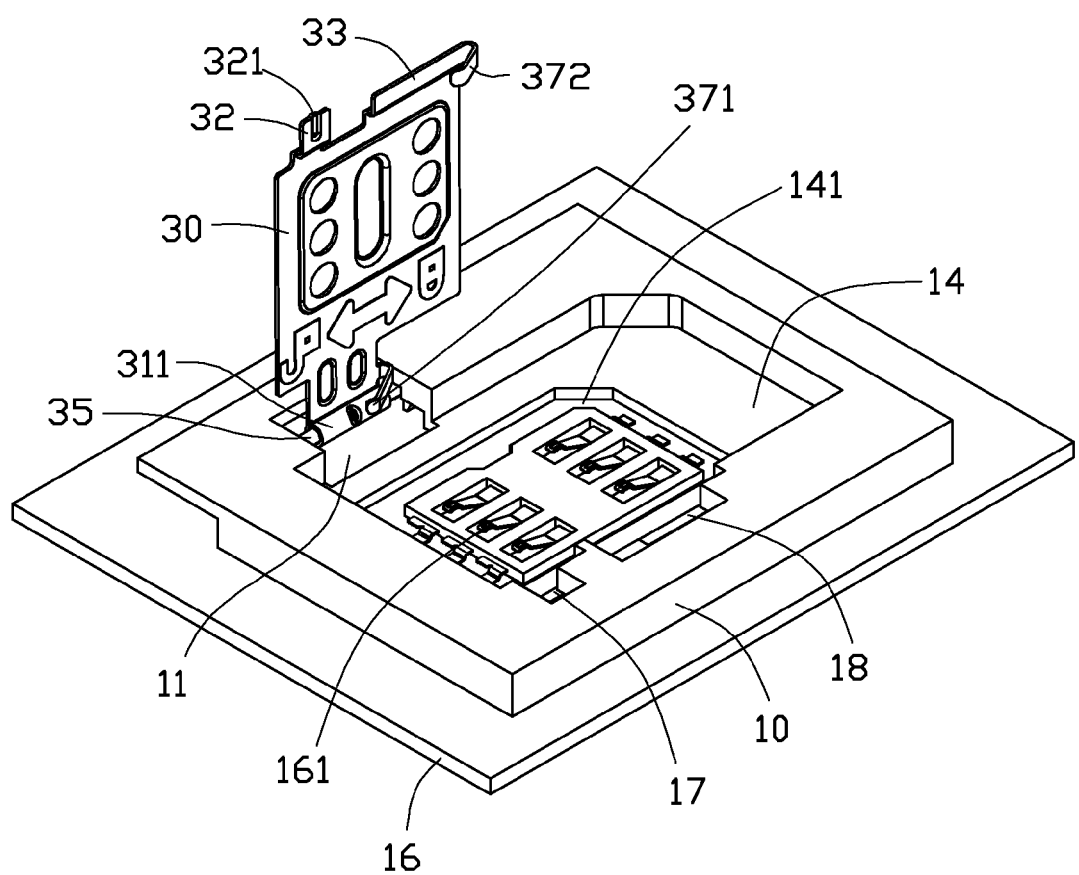
FIG. 4 is an isometric view of the assembled surface contact card holder.
Figure 5:
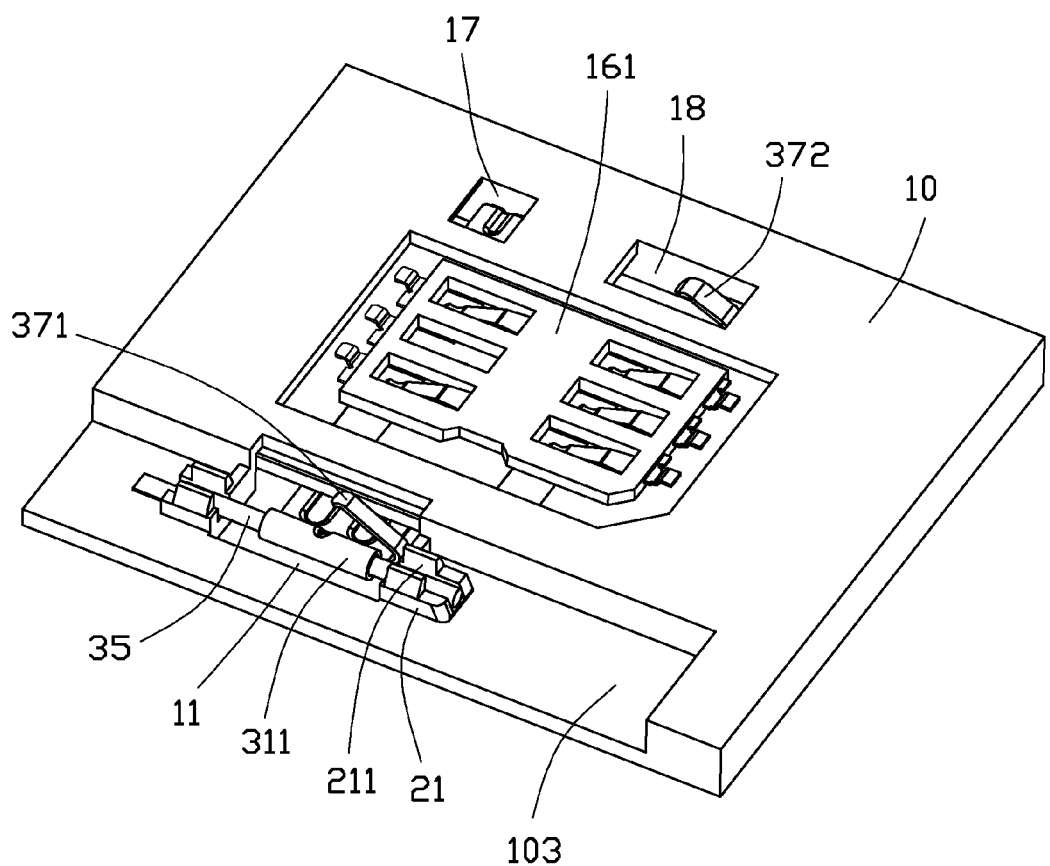
FIG. 5 is a schematic view of the surface contact card holder with the surface contact card.
Figure 6:
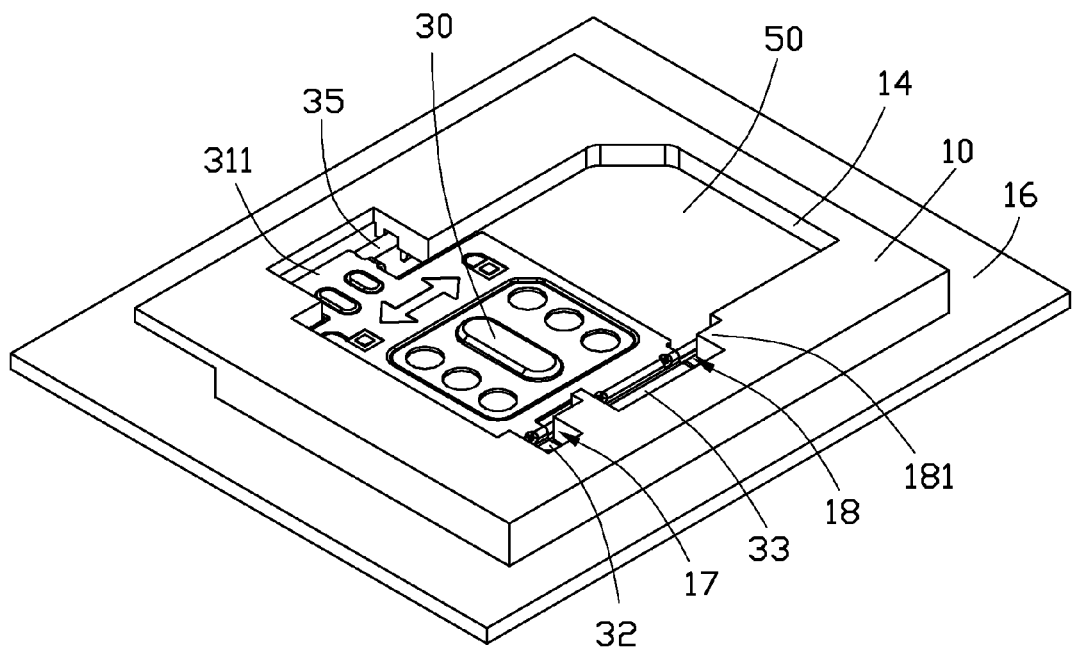
FIGS. 6 and 7 are schematic views of the surface contact card holder showing different states of the cover slid along the main body for positioning the surface contact card in place.
Figure 7:
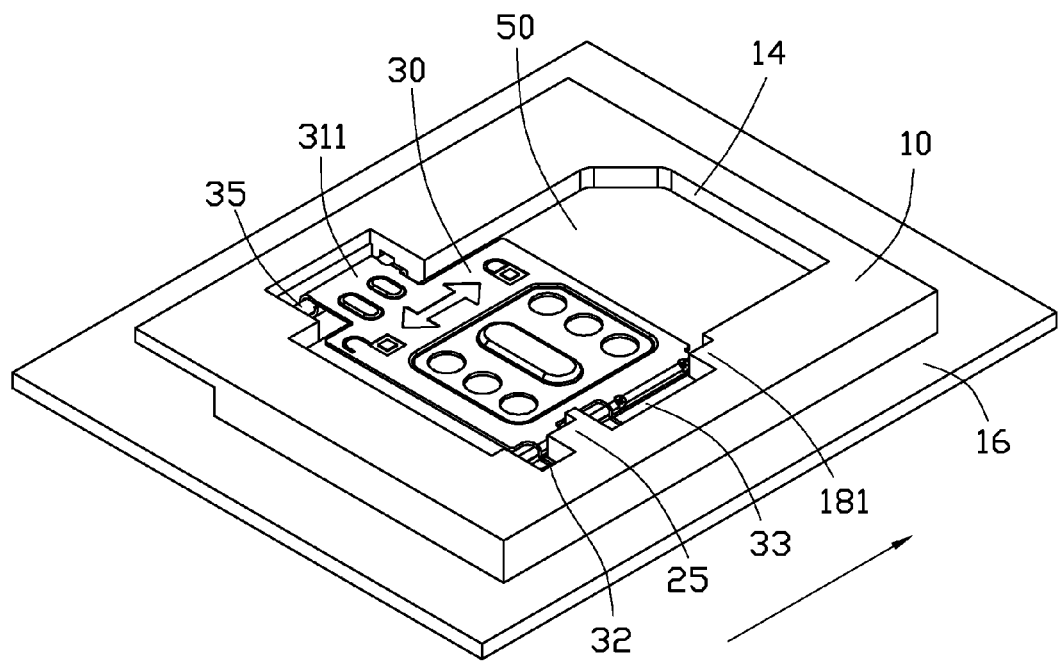

To assemble the surface contact card holder, referring to FIGS. 4 and 5, the cover 30 is positioned above the receiving groove 14, and the hinge portion 311 is aligned with the latching portions 21. The pivotal shaft 35 extends through the hinge portion 311, with its opposite ends latched into the containing grooves 211. The first finger 371 is received in the side slot 11, and the second finger 372 is exposed from the latching hole 182. The first finger 371 and the second finger 372 electronically connect to the printed circuit board 16.

To insert the surface contact card 50 into the holder 200, the latching tab 32 and the extending plate 33 are pulled away from the cover 30. The surface contact card 50 is inserted into the receiving groove 14 of the main body 10. The cover 30 is pivoted around the pivotal shaft 35 to cover the receiving groove 14. The latching tab 32 is received in the positioning groove 17, and the extending plate 33 is received in the latching groove 18. Then, the cover 30 is slid until the protrusion 321 is latched into the notch 251 and the extending plate 33 is latched by the stepped edge 181 for preventing the cover 30 from moving. This structure allows the surface contact card 50 to be held steadily by the cover 30.

It is believed that the present embodiments and their advantages will be understood from the foregoing description, and it will be apparent that various changes may be made thereto without departing from the spirit and scope of the disclosure or sacrificing all of its material advantages, the examples hereinbefore described merely being preferred or exemplary embodiments of the disclosure.

What is claimed is:

1. A holder for a surface contact card, comprising:
   a main body having a block and defining a receiving groove configured for receiving the surface contact card;
   a pivotal shaft; and a cover comprising a hinge portion and a latching tab, the pivotal shaft extending through the hinge portion and connected to the main body;

wherein the cover is pivotally and slidably engaged with the main body for covering the receiving groove, and the latching tab is latched with the block;

wherein the main body defines a side slot adjacent to a first side of the receiving groove;

the main body defines a positioning groove, a latching groove at a second side of the receiving groove, the positioning groove and the latching groove communicate with the receiving groove, and the block is defined between the positioning groove and the latching groove;

the positioning groove has a bottom surface, the latching groove has a bottom wall and a stepped edge, the block has a notch extending from an inner surface toward the bottom surface.

2. The holder as claimed in claim 1, wherein the hinge portion is received in the side slot.

3. The holder as claimed in claim 1, wherein the main body has a recess communicating with the side slot, two latching portions are formed in the recess and are at opposite sides of the side slot, and each latching portion has a containing groove for containing the pivotal shaft.

4. The holder as claimed in claim 1, wherein the cover includes a cover body and an extending plate, the hinge portion extends from one side of the cover body, and the latching tab and the extending plate extend from another side of the cover body and are spaced from each other.

5. An electronic device comprising a holder for a surface contact card, the holder mounted on the electronic device and comprising:

a main body defining a receiving groove configured for receiving the surface contact card;

a pivotal shaft; and a cover comprising a hinge portion, the pivotal shaft extending through the hinge portion and connected to the main body;

wherein the cover is pivotally and slidably engaged with the main body for covering the receiving groove, and the cover is latched on the main body;

wherein the main body defines a side slot adjacent to a first side of the receiving groove;

the main body defines a positioning groove, a latching groove at a second side of the receiving groove, the positioning groove and the latching groove communicate with the receiving groove, and the block is defined between the positioning groove and the latching groove;

the positioning groove has a bottom surface, the latching groove has a bottom wall and a stepped edge, the block has a notch extending from an inner surface toward the bottom surface.

6. The electronic device as claimed in claim 5, wherein the cover includes a cover body and an extending plate, the hinge portion extends from one side of the cover body, and a latching tab and the extending plate extend from another side of the cover body and are spaced from each other.

7. The electronic device as claimed in claim 6, wherein the hinge portion is received in the side slot.

* * * * *